July 20, 1965 H. T. MANN ETAL 3,196,427

SUPERCONDUCTIVE ANALOG TO DIGITAL CONVERTER

Filed Nov. 14, 1960

HORACE T. MANN
DAVID G. FLADLIEN
INVENTORS

BY Jerry A. Dinardo
AGENT

Albert Rosen
ATTORNEY

United States Patent Office 3,196,427

Patented July 20, 1965

3,196,427

SUPERCONDUCTIVE ANALOG TO DIGITAL CONVERTER

Horace T. Mann, Palos Verdes Estates, and David G. Fladlien, Los Angeles, Calif., assignors, by mesne assignments, to Thompson Ramo Wooldridge Inc., Cleveland, Ohio, a corporation of Ohio Filed Nov. 14, 1960, Ser. No. 68,889

11 Claims. (Cl. 340—347)

This invention relates to improvements in the art of converting analog electrical signals into corresponding digital electrical signals, and more particularly to a novel arrangement of super-conductive elements for such conversion purposes.

It is known that many materials lose all apparent electrical resistance when they are subjected to very low temperatures, in the vicinity of absolute zero. A material exhibiting this characteristic property is called a superconductor and the related phenomenon is termed superconductivity. The transition from the resistive state to the superconductive state occurs abruptly at a critical temperature known as the transition temperature, the particular temperature differing for each material.

It is also known that a transition from a superconducting to a resistive state can be induced in a superconductor by applying a magnetic field to the superconductor. The magnetic field can be applied externally to the superconductor or it can be induced internally by the flow of electric current through the superconductor. When the magnetic field or current is removed, the superconductor reverts to its superconducting state. In the presence of an external magnetic field, a superconductor requires less directly applied current, termed the critical current, to cause a transition, than it does when there is no external magnetic field present. By the same token, a superconductor carrying an internal current requires less externally applied magnetic field, called the critical external field, than it does when there is no current flowing through the material.

In data processing and digital computing systems there is a need for electrical components of reduced size and increased speed. In such systems digital information is frequently represented by an electrical current which may be passed through a myriad of electrical circuits to perform computations and manipulations of a complexity and magnitude that would be impractical by any manual means. For example, superconductive digital data handling arrangements have been proposed that are capable of switching within a millimicrosecond or less. In addition to such high switching speeds, such superconductive elements and arrangements are also characterized by their extreme compactness and by their relative ease of manufacture. However, such previous superconductive data handling arrangements have not proven satisfactory in handling analog information—and while analog-to-digital converters of conventional varieties (that is, of varieties that do not make use of the phenomenon of superconductivity) have been proposed, such a hybrid arrangement leaves a number of things to be desired. For example, the compactness realized through the use of a superconductive digital computer arrangement would be sacrificed in part through the need to resort to analog-to-digital converters of the conventional kind. Then, too, the provision of a superconductive converter construction, for use with superconductive digital data processing arrangements, would also contribute to a more effective utilization of the low temperature equipment needed for the super-conductive computer switching elements.

Accordingly, an object of this invention is to provide an improved analog-to-digital converter arrangement that is capable of high speed operation, for example at speeds of the order of microseconds or less per converter switching operation.

Another object of the invention is to provide an improved superconductive electrical circuit that is capable of converting analog electrical information into corresponding digital electrical information at high speeds, such a circuit arrangement being characterized by extreme compactness and relatively great ease of manufacture.

The foregoing and other objects are achieved through the provision of a superconductive network which includes at least one branch for receiving an analog input signal to be converted. The superconductive network is constructed to remain in the superconducting state while it is subjected to the analog input signal. Associated with the superconductive network are a plurality of superconductive gate elements, with each gate element magnetically and nonconductively coupled to a different portion of the superconductive network. The gate elements are constructed and arranged, relative to the different portions of the superconductive network, to transform, between superconducting and resistive states, at different discrete levels of the analog input signal. The number of gate elements that are in any given state during the application of the analog input signal provides a digital indication of the signal.

In accordance with one embodiment of the invention, conversion is achieved through the provision of a superconductive circuit arrangement including a plurality of superconductive circuit branches or paths connected in electrical parallel across a pair of input terminals. Each circuit path is associated with a weighted inductance. A plurality of superconductive gate elements are provided, with each gate element being coupled to a respective one of the circuit paths.

When an analog current is applied to the input terminals, the current divides between the superconductive circuit paths inversely as their inductances, the lower the inductance the higher the path current. The current in each loop gives rise to a magnetic field which acts on the respective gate element coupled to that path. As the input current increases, each path current, and the corresponding magnetic field applied to each gate element, increases accordingly. By design, the weighted inductances of the circuit paths are so related to the critical fields of the respective gate elements that different ones of the gate elements are caused to go resistive at different discrete levels of input current. Thus the number of gate elements that are in the resistive state at any particular time is a digital indication of the amplitude of the analog input current.

At temperatures near absolute zero some materials apparently lose all resistance to the flow of electrical current and become what appear to be perfect conductors of electricity. This phenomenon is termed superconductivity and the temperature at which the change occurs, from a normally resistive state to the superconductive state, is called the transition temperature. For example, the following materials have transition temperatures, and become superconductive as noted:

| | ° Kelvin |
|---|---|
| Niobium | 8 |
| Lead | 7.2 |
| Vanadium | 5.1 |
| Tantalum | 4.4 |
| Mercury | 4.1 |
| Tin | 3.7 |
| Indium | 3.4 |
| Thallium | 2.4 |
| Aluminum | 1.2 |

Only a few of the materials exhibiting the phenomenon of superconductivity are listed above. Other elements, and many alloys and compounds, become superconductive at temperatures ranging between 0° and around 20° Kelvin. A discussion of many such materials may be found in a book entitled "Superconductivity" by D. Schoenberg, Cambridge University Press, Cambridge, England, 1952.

The above-listed transition temperatures apply only where the materials are in a substantially zero magnetic field. In the presence of a magnetic field the transition temperature is decreased. Consequently, in the presence of a magnetic field a given material may be in an electrically resistance state at a temperature below the absence-of-magnetic-field or normal transition temperature. A discussion of this aspect of the phenomenon of superconductivity may be found in U.S. Patent 2,832,897, entitled "Magnetically Controlled Gating Element," granted to Dudley A. Buck.

In addition, the above-listed transition temperatures apply only in the absence of electrical current flow through the material. When a current flows through a material, the transition temperature of the material is decreased. In such a case the material may be in an electrically resistive state even though the temperature of the material is lower than the normal transition temperature. The action of a current in lowering the temperature at which the transition occurs (from a state of normal electrical resistivity to one of superconductivity) is similar to the lowering of the transition temperature by an external magnetic field, inasmuch as the flow of current itself induces a magnetic field.

Accordingly, when a material is held at a temperature below its normal transition temperature for a zero magnetic field, and is thus in a superconducting state, the superconducting condition of the material may be extinguished by the application of an external magnetic field to the material or by passing an electric current internally through the material. The minimum values of external magnetic field or internal electric current required to effect the superconducting to resistive transition are called the critical field and critical current, respectively.

Figure 1:
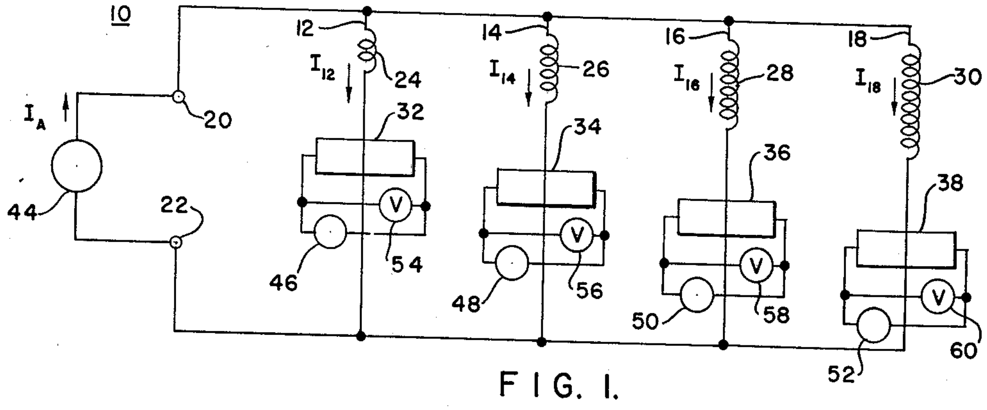
FIG. 1 is a schematic circuit illustrating one form of analog-to-digital converter according to the invention.

Referring now to FIG. 1, there is shown one form of a superconductive circuit arrangement for converting an analog input signal into a corresponding digital output. The converter arrangement 10 includes a plurality of superconductive circuit paths, exemplified by four paths numbered 12, 14, 16, and 18, connected electrically in parallel across a pair of input terminals 20 and 22. Each of the parallel paths 12–18 is represented by a weighted inductance, the inductances being illustrated schematically and numbered 24, 26, 28, and 30, respectively. A superconductive gate element is coupled to each of the superconductive paths 12–18, the gate elements being numbered 32, 34, 36, and 38. The coupling between each of the gate elements 32–38 and a respective one of the super-conductive paths 12–18 is such that when a current of a certain magnitude flows in one of the paths, a sufficient magnetic field will be created about the path, in the vicinity of the gate element coupled thereto, to cause the gate element to change from the superconducting to the resistive state.

Each of the superconductive paths 12–18 may comprise an elongated thin film element of a superconductive material, such as lead or niobium, which has a relatively high transition temperature as compared to the material, such as tin or indium, of the gate elements 32–38. Such a choice of materials will insure that the superconductive paths 12–18 will remain superconducting under conditions of high current flowing therethrough, whereas such high current flows give rise to magnetic fields which, under certain conditions, will exceed the critical fields of the gate elements 32–38, thereby causing the latter to go resistive.

In this embodiment, the superconductive circuit paths 12–18 are designed with different values of inductances 24–30. The differences in inductance may be achieved by forming the superconductive paths 12–18 with different lengths, as by making them of sinuous form. In this connection, it is understood that the inductances 24–30 may be distributed along each path, or they may take the form of lumped parameters such as coils. The gate elements 32–38 are preferably designed with the same critical field value, as by making them as nearly identical as possible. In addition, the widths of the superconductive paths 12–18 at their intersections with the gate elements 32–38 are made equal to each other, so that the same magnitude of current flowing in each of the superconductive paths 12–18 will impress the same magnitude of magnetic field on the gate elements 32–38. Thus, each of the gate elements 32–38 will go resistive at a given critical field impressed thereon by the same magnitude of current flowing in the several superconductive paths 12–18.

Figure 2:
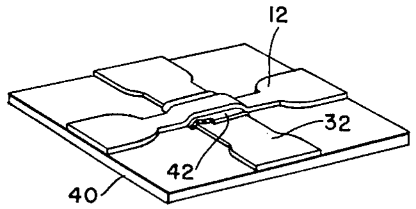
FIG. 2 is a perspective view illustrating the construction of a portion of the circuit of FIG. 1.

FIG. 2 illustrates one form of construction of a portion of the converter arrangement 10 including one of the gate elements (gate element 32) and one of the superconductive paths (superconductive path 12). As shown, the gate element 32 may comprise a relatively wide, elongated thin film of superconductive material disposed on an insulating substrate 40, as of glass or quartz. A portion of the gate element 32 is covered with a very thin film 42 (of the order of 200 angstrom units or less) of insulation material, such as silicon monoxide or a polymerized silicone. A relatively narrow, elongated thin film of superconductive material comprising the superconductive path 12 is disposed on the insulation film 42 and across the gate element 32. Alternatively, the gate element 32 and superconductive path 12 may be arranged parallel to each other. However, the former, or cross arrangement, may be preferred, since it requires a smaller amount of current in the superconductive path 12 to transform the gate element 32.

Figure 3:
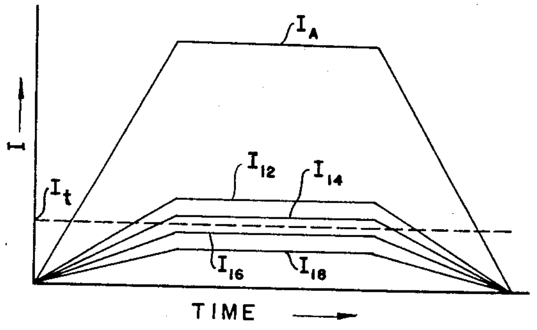
FIG. 3 is a graph of current waveforms useful in explaning the operation of the circuit of FIG. 1.

In the operation of the converter arrangement 10, an analog current signal is applied to the input terminals 20 and 22 from a signal source 44. The analog current signal may be represented by a current pulse $I_A$ of given amplitude, as shown in FIG. 3. Since the various superconductive paths 12–18 have different inductances, the currents in the paths 12–18 will be different from each other, the division of currents being in the inverse ratio of the inductances. For example, superconductive path 12 having the smallest inductance 24 will carry the highest current $I_{12}$, and the paths 14, 16, and 18 which have correspondingly higher inductances 26, 28, and 30, will carry corresponding lower currents $I_{14}$, $I_{16}$, and $I_{18}$, respectively.

As indicated previously, all of the gate elements 32–38 are designed with the same critical field. It will be assumed that such a magnitude of critical field can be produced by a current flow in any of the superconductive paths 12–18 which exceeds a threshold level, which for the sake of this illustration, is called $I_t$ having a magnitude as shown in FIG. 3. In this example, it is observed that the current level $I_t$ is exceeded by the currents $I_{12}$ and $I_{14}$ in two of the superconductive paths 12 and 14 but not by the currents $I_{16}$ and $I_{18}$ in the other two superconductive paths $I_{16}$ and $I_{18}$. Since the currents $I_{12}$ and $I_{14}$ will give rise to magnetic fields in the superconductive paths 12 and 14 which exceed the critical field of the two gate elements 32 and 34 in the paths 12 and 14 respectively, these two gate elements 32 and 34 will transform to the resistive state. However, since the remaining two currents $I_{16}$ and $I_{18}$ do not create sufficient fields to exceed the critical field of the remaining two gate elements 36 and 38, the latter gate elements 36 and 38 will remain superconducting.

In order to determine whether or not the gate elements 32–38 go resistive, sensing circuits may be provided in conjunction with the gate elements 32–38. As shown, each of the sensing circuits may comprise a sensing current source (sources 46, 48, 50, and 52) and a voltage sensing device (devices 54, 56, 58, and 60) connected across a respective gate element. The application of a small magnitude sensing current from the sensing current source 46, for example, to the gate element 32, will cause a voltage drop to develop across the gate element 32 when it is in the resistive state, with the voltage drop being sensed by the voltage sensing device 54. Similarly, the application of sensing current to the other transformed gate element 34 will cause a voltage drop to occur across the gate element 34, which is sensed by the voltage sensing device 56. However, the application of sensing currents to the gate elements 36 and 38 which do not transform will not result in a voltage drop being developed thereacross, the absence of voltage being indicated by the voltage sensing devices 58 and 60.

Thus, the number of gate elements that are transformed, in this example two, is a digital indication of the magnitude of the analog signal current $I_A$. Similarly, when the magnitude of the analog current $I_A$ is greater than that of the previous example, the superconductive path currents $I_{12}$, $I_{14}$, $I_{16}$, and $I_{18}$ are correspondingly greater. To the extent that the analog current $I_A$ is greater, one or both of the lower magnitude superconductive path currents $I_{16}$ and $I_{18}$, in addition to the higher magnitude superconductive path currents $I_{12}$ and $I_{14}$, will exceed the threshold current level $I_t$. Accordingly, a greater number of the gate elements 32–38 will be transformed, the exact number serving as a digital indication of the magnitude of the analog current $I_A$. Conversely, a lower magnitude of analog current will be represented by a correspondingly lower number of transformed gate elements 32–38.

Figure 4:
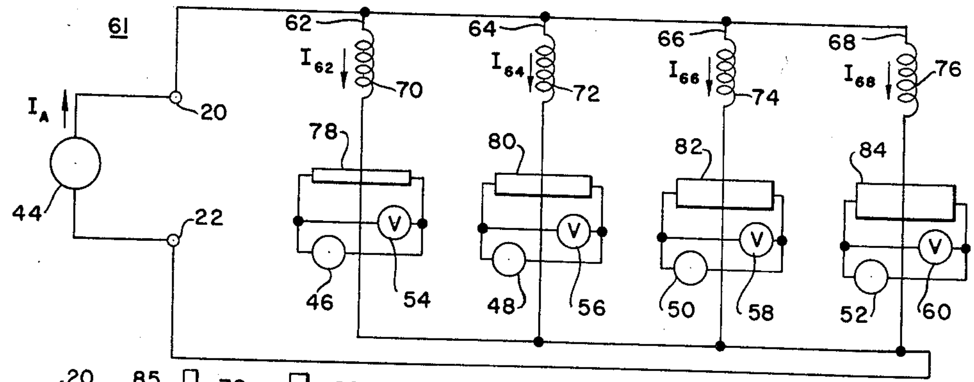
FIG. 4 is a schematic circuit illustrating a modified form of analog-to-digital converter according to the invention.

FIG. 4 illustrates a modified form of converter arrangement 61, in which a plurality of substantially identical superconductive paths 62, 64, 66, and 68 are connected across the input terminals 20 and 22. The superconductive paths 62, 64, 66, and 68 are designed with equal inductances 70, 72, 74, and 76, respectively, so that no matter what magnitude of analog current $I_A$ is applied to the input terminals 20 and 22, the superconductive path currents $I_{62}$, $I_{64}$, $I_{66}$, and $I_{68}$ are always equal to each other. Of course, the magnitude of each of the superconductive path currents $I_{62}$–$I_{68}$ is proportional to the magnitude of the analog current $I_A$.

A superconductive gate element is coupled to each of the superconductive paths 62–68, the gate elements, numbered 78, 80, 82, and 84 having mutually different critical field values. For example, the gate elements 78–84 have critical field values which increase in that order. This relationship may be effected by fabricating the gate elements 78–84 with the equal thicknesses but with different widths, as shown. Thus, with equal gate currents flowing through all of the gate elements 78–84 from sensing current sources 46–52, the current densities, per unit width of the gate elements will all be different. Alternatively, the gate elements 78 to 84 may be identical to each other, but may have differing degrees of coupling to the superconductive paths 62–68, as by spacing them by different amounts from the superconductors constituting the superconductive paths 62–68. In the operation of the converter arrangement 61, the sensing current through each gate element is limited to a low value below the critical current value for each of the gate elements 78–84, so that all of the gate elements are in the superconducting state in the absence of current flow in the superconductive paths 62–68. When an analog signal current $I_A$ is applied to the input terminals 20 and 22, the current $I_A$ will divide equally between the superconductive paths 62–68, the magnitude of each path current $I_{62}$–$I_{68}$ being proportional to the magnitude of the analog current $I_A$. Since the narrowest gate element 78 has the lowest critical field of all of the gate elements 78–84, it requires the least amount of superconductive path current to cause it to transform. Similarly, the wider gate elements 80, 82, and 84 require proportionately greater amounts of superconductive path currents, according to their increasing widths for transformation. Thus, at some low magnitude of analog current $I_A$, only the narrowest gate element 78 will transform. The digit 1, therefore, corresponding to the switching of one gate element, represents the low level of the analog current $I_A$. At some higher level of analog current $I_A$, both the narrowest gate element 78 and the next wider gate element 80 will transform. The digit 2, corresponding to the switching of two gate elements, thus represents this next higher level of analog current. Similarly, at successively higher levels of analog currents, the three gate elements 78–82, and then all four gate elements 78–84, will transform to indicate the digits 3 and 4 as representing the next higher levels of analog current $I_A$. Thus, it is seen that the analog signal $I_A$ can be represented by any one of four digital output signals.

Figure 5:
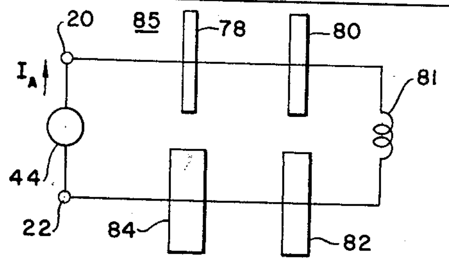
FIG. 5 is a schematic circuit illustrating a further form of the analog-to-digital converter according to the invention.

In the foregoing embodiment of FIG. 4, it is noted that the various gate elements 78–84 are designed to respond to different levels of superconductive path current even though the currents flowing in the various paths at any instant of time are always equal to each other. Accordingly, a more simplified converter arrangement can be produced by coupling the different gate elements to a single path carrying the same current, either the entire analog current or a portion thereof. In the converter 85 shown in FIG. 5, for example, a single superconductive path 86 is connected across the terminals 20 and 22, and the different gate elements 78 to 84 are coupled to different portions of the path 86. The path 86 is associated with a given inductance 88 whose value is preferably kept to a minimum to optimize the speed of response of the converter 85. The sensing circuits for the gate elements 78–84 may be the same as those shown in FIG. 4. Since the operation of this converter 85 is similar to that of the converter 61 of FIG. 4, no further discussion thereof is necessary.

While in the foregoing embodiments a maximum number of four digits are used to represent an analog signal, it is appreciated that a greater number of digits can be produced by increasing the number of superconductive circuit paths and/or gate elements coupled to each path. For example, the arrangements of FIGS. 4 and 5 can be combined to produce a converter having a plurality of superconductive paths, with each path having a plurality of gate elements coupled thereto. The number of digits is limited only by the practical difficulties of fabricating superconductive elements with sufficient differences in physical dimensions or configurations.

What is claimed is:

1. A superconductive circuit arrangement comprising: a plurality of superconductive paths connected in a parallel electrical circuit across a pair of input terminals, a plurality of superconductive gate elements each magnetically and non-conductively coupled to a respective one of said superconductive paths, each of said gate elements being normally superconductive in the absence of analog input current applied to said input terminals, each of said superconductive paths including a weighted inductance for limiting the current flowing therein to a value that is related to the critical magnetic field of the respective gate element in such a way that different ones of said gate elements are caused to go resistive at different discrete levels of analog input current applied to said terminals.

2. A superconductive circuit arrangement according to claim 1, wherein the inductances of said superconductive paths are substantially equal to each other and said gate elements have respectively different critical fields.

3. A superconductive circuit arrangement according to claim 1, wherein the inductances of said superconductive paths are different from each other.

4. A superconductive circuit arrangement according to claim 1, wherein said gate elements have respectively different critical fields.

5. A superconductive circuit arrangement according to claim 1, wherein said gate elements have substantially equal critical fields and the inductances of said superconductive paths are different from each other.

6. A superconductive circuit arrangement comprising: a plurality of superconductive paths connected in a parallel electrical circuit across a pair of input terminals, a plurality of superconductive gate elements each magnetically and non-conductively coupled to a respective one of said superconductive paths, each of said gate elements being normally superconductive in the absence of input current applied to said input terminals, each of said superconductive paths including a weighted inductance for limiting the current flowing therein to a value that is related to the critical magnetic field of the respective gate element in such a way that different ones of said gate elements are caused to go resistive at different discrete levels of analog input current applied to said terminals, and sensing means connected to each of said gate elements to determine the state thereof when an analog input current is present at said terminals and thereby provide a digital indication of the magnitude of said analog input current.

7. A superconductive circuit arrangement according to claim 6, wherein said sensing means includes a current source for supplying current to each of said gate elements, and a voltage sensing device connected across each of said gate elements.

8. A superconductive circuit arrangement comprising: a plurality of superconductive paths connected in a parallel electrical circuit across a pair of input terminals, each of said superconductive paths being constructed of a relatively high transition temperature material, a plurality of superconductive gate elements each magnetically and non-conductively coupled to a respective one of said superconductive paths, each of said gate elements being constructed of a relatively low transition temperature material and being normally superconductive in the absence of input current applied to said input terminals, each of said superconductive paths including a weighted inductance for limiting current flow therein to a value that is related to the critical magnetic field of the respective gate element in such a way that different ones of said gate elements are caused to go resistive at different discrete levels of analog input current applied to said terminals, and sensing means connected to each of said gate elements to determine the state thereof when an analog input current is present at said terminals and thereby to provide a digital indication of the magnitude of said analog input current.

9. A superconductive circuit arrangement according to claim 8, wherein each of said superconductive paths comprises a first thin film of superconductive material, and each of said gate elements comprises a second thin film of superconductive material closely spaced from and at righ angles to said first thin film.

10. A superconductive circuit arrangement according to claim 8, wherein the inductances of said superconductive paths are different from each other and said gate elements comprise thin superconductive films all having substantially equal thickness and width dimensions.

11. A superconductive circuit arrangement according to claim 8, wherein the inductances of said superconductive paths are substantially equal to each other and said gate elements comprise thin superconductive film having mutually different width dimensions and substantially equal thickness dimensions.

References Cited by the Examiner

UNITED STATES PATENTS

| | | | |
|---|---|---|---|
| 2,696,347 | 12/54 | Lo | 340—346 |
| 2,832,897 | 4/58 | Buck | 340—173.1 |
| 2,958,848 | 11/60 | Garwin | 340—173.1 |
| 2,959,688 | 11/60 | Buck | 340—173.1 |
| 2,962,704 | 11/60 | Buser | 340—172 |
| 3,050,721 | 8/62 | Anderson | 340—347 |
| 3,055,775 | 9/62 | Crittenden et al. | 307—88.5 |
| 3,061,738 | 10/62 | Wilson | 307—88.5 |
| 3,065,359 | 11/62 | Mackay | 340—173.1 |

OTHER REFERENCES

Publication: D. A. Buck: "The Cryotron—A Superconductive Computer Component," Proc. I.R.E., vol. 44, No. 4, pp. 482–493, April 1956.

Strohm: Analog to Digital Conversion Using Cryotrons, "IBM Technical Disclosure Bulletin," vol. 3, No. 4, September 1960, pp. 64–65.

MALCOLM A. MORRISON, *Primary Examiner.*

IRVING L. SRAGOW, *Examiner.*